United States Patent
He et al.

(10) Patent No.: US 10,229,025 B2
(45) Date of Patent: Mar. 12, 2019

(54) NON-VOLATILE MEMORY REPAIR CIRCUIT

(71) Applicant: NXP USA, INC., Austin, TX (US)

(72) Inventors: Xuewen He, Suzhou (CN); Xiaoxiang Geng, Suzhou (CN); Lei Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 195 days.

(21) Appl. No.: 15/593,326

(22) Filed: May 12, 2017

(65) Prior Publication Data
US 2018/0308562 A1    Oct. 25, 2018

(30) Foreign Application Priority Data
Apr. 19, 2017    (CN) .......................... 2017 1 0255450

(51) Int. Cl.
| | | |
|---|---|---|
| *G06F 11/07* | (2006.01) | |
| *G06F 11/10* | (2006.01) | |
| *G06F 11/16* | (2006.01) | |
| *G06F 11/18* | (2006.01) | |
| *G06F 11/20* | (2006.01) | |

(Continued)

(52) U.S. Cl.
CPC ...... *G06F 11/2094* (2013.01); *G06F 11/0793* (2013.01); *G06F 11/1064* (2013.01); *G06F 11/1666* (2013.01); *G06F 11/18* (2013.01); *G06F 11/181* (2013.01); *G11C 29/44* (2013.01); *G11C 29/4401* (2013.01); *G11C 29/76* (2013.01); *G11C 29/789* (2013.01); *G11C 29/808* (2013.01); *G11C 29/846* (2013.01); *G06F 2201/805* (2013.01); *G06F 2201/82* (2013.01); *G11C 2029/0403* (2013.01); *G11C 2029/1208* (2013.01); *G11C 2029/4402* (2013.01)

(58) Field of Classification Search
CPC ..... G11C 29/44; G11C 29/4401; G11C 29/76; G11C 29/789; G11C 29/808; G11C 29/846; G11C 2029/0403; G11C 2029/1208; G11C 2029/4402; G06F 11/2094; G06F 2201/805; G06F 2201/82; G06F 2029/0403; G06F 11/1666; G06F 11/18; G06F 11/181; G06F 11/1064; G06F 11/0793
See application file for complete search history.

(56) References Cited

U.S. PATENT DOCUMENTS

| | | | |
|---|---|---|---|
| 4,376,300 A | | 3/1983 | Tsang |
| 5,124,948 A | * | 6/1992 | Takizawa ............. G11C 29/822 365/104 |

(Continued)

*Primary Examiner* — Paul Contino
(74) *Attorney, Agent, or Firm* — Charles E. Bergere

(57) ABSTRACT

An integrated circuit includes on-chip flash memory, a EEPROM, cache memory, and a repair controller. When a defective address is detected in the flash memory, data slotted to be stored at the defective address is stored in the EEPROM by the repair controller. The cache memory includes a content addressable memory (CAM) that checks read addresses with the defective memory address and if there is a match, the data stored in the EEPROM is moved to the cache so that it can be output in place of data stored at the defective location of the flash memory. The memory repair system does not require any fuses nor is the flash required to include redundant rows or columns. Further, defective addresses can be detected and repaired on-the-fly.

20 Claims, 1 Drawing Sheet

(51) Int. Cl.
    *G11C 29/00*         (2006.01)
    *G11C 29/04*         (2006.01)
    *G11C 29/12*         (2006.01)
    *G11C 29/44*         (2006.01)

(56) References Cited

U.S. PATENT DOCUMENTS

| | | |
|---|---|---|
| 5,349,558 A | 9/1994 | Cleveland et al. |
| 5,687,345 A | 11/1997 | Matsubara et al. |
| 5,717,636 A | 2/1998 | Dallabora et al. |
| 6,351,413 B1 | 2/2002 | Micheloni et al. |
| 6,484,271 B1 * | 11/2002 | Gray ............... G11C 29/70 |
| | | 714/5.1 |
| 7,216,277 B1 | 5/2007 | Ngai |
| 7,236,397 B2 * | 6/2007 | Kim ............... G11C 29/846 |
| | | 365/185.09 |
| 7,336,549 B2 | 2/2008 | Min |
| 7,809,998 B1 * | 10/2010 | Sutardja ......... G06F 11/1008 |
| | | 365/201 |
| 7,949,913 B2 | 5/2011 | Norrod |
| 8,218,383 B1 | 7/2012 | Wu |
| 8,527,839 B2 | 9/2013 | Hung et al. |
| 8,848,443 B2 | 9/2014 | Kim |
| 8,947,957 B2 | 2/2015 | Yu et al. |
| 10,032,515 B2 * | 7/2018 | Pelley ............... G11C 15/04 |
| 2002/0019961 A1 | 2/2002 | Blodgett |
| 2003/0035322 A1 | 2/2003 | Wong |
| 2004/0123181 A1 | 6/2004 | Moon et al. |
| 2005/0190615 A1 | 9/2005 | Linde et al. |
| 2006/0092725 A1 * | 5/2006 | Min ............... G11C 29/787 |
| | | 365/200 |
| 2008/0307251 A1 | 12/2008 | Rahman |
| 2009/0043957 A1 * | 2/2009 | Davis ............... G11C 15/00 |
| | | 711/108 |
| 2009/0316460 A1 * | 12/2009 | Orginos ......... G11C 29/4401 |
| | | 365/49.1 |
| 2011/0249480 A1 * | 10/2011 | Cho ............... G11C 29/789 |
| | | 365/49.1 |
| 2012/0221904 A1 * | 8/2012 | Park ............... G11C 16/349 |
| | | 714/723 |
| 2013/0139033 A1 * | 5/2013 | Yu ............... G06F 11/1048 |
| | | 714/766 |
| 2014/0157045 A1 * | 6/2014 | Kim ............... G06F 11/073 |
| | | 714/6.13 |
| 2015/0370708 A1 * | 12/2015 | Butler ............. G06F 11/1064 |
| | | 714/766 |
| 2016/0203044 A1 * | 7/2016 | Kwon ............... G11C 29/76 |
| | | 714/767 |
| 2017/0083418 A1 | 3/2017 | Li et al. |
| 2017/0200512 A1 * | 7/2017 | Lee ............... G11C 7/06 |
| 2017/0249993 A1 * | 8/2017 | Pelley ............... G11C 15/04 |
| 2017/0255516 A1 * | 9/2017 | Zhang ............. G06F 11/1072 |

\* cited by examiner

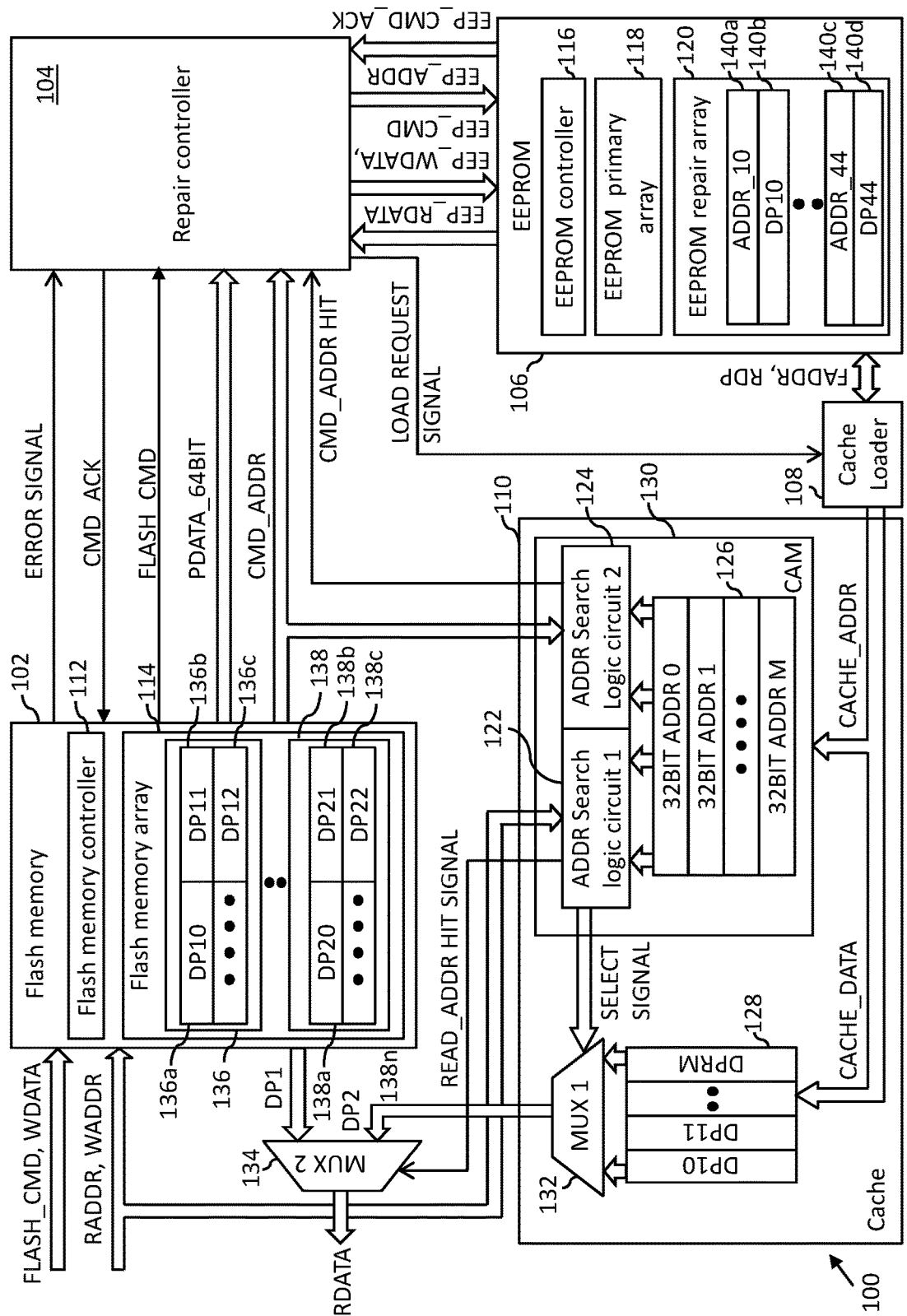

NON-VOLATILE MEMORY REPAIR CIRCUIT

BACKGROUND

The present invention relates generally to integrated circuits that include memory devices, and more particularly, to an integrated circuit with a memory and a memory repair system that repairs or makes accommodations for defective memory cells.

Semiconductor integrated circuits often include on-chip memory, like flash memory. The flash memory may have some defective memory cells due to, for instance, manufacturing process variations or aging. Rather than discarding the integrated circuit, it is more cost effective to provide circuitry for repairing the memory.

A known technique to avoid discarding the integrated circuits with on-chip memory that have defective memory cells is to use fuses such as polyfuses and antifuses and redundant memory sectors. Typically, a memory includes a set of memory sectors, and each sector includes a set of memory cells. The memory also includes a self-test circuit that tests each memory sector to located any defective memory cells. Methods of identifying defective memory cells are well known. A memory sector having one or more defective memory cells is referred to as a faulty memory sector.

When the self-test circuit identifies a faulty memory sector, a fuse corresponding to the faulty memory sector is deactivated using a laser or a voltage supply. A fuse corresponding to a redundant memory sector also is activated using the laser or the voltage supply based on the type of fuse. The redundant memory sector corresponds to the faulty memory sector. Then, the data that was to be stored in the faulty memory sector is instead stored in the redundant memory sector. The redundant memory sector is thus substituted for the faulty memory sector, and this is known as repairing the memory. However, this technique uses a large number of resources such as the fuses and the redundant memory sector. Further, the method of activating and deactivating the fuses is prone to errors and may result in improper operation of the memory device. It also is imperative that the redundant memory sector is the same memory type as the faulty memory sector. As the activation and deactivation of the fuses require external components such as lasers, this technique can be implemented only during initial testing of the integrated circuit (i.e., at the factory). There also is the possibility of the deactivated fuse being reactivated due to faulty deactivation and influences of external parameters such as temperature. Further, the faulty memory sector may have a large number of memory cells that are not defective apart from the few defective cells.

Another known method is the use of a repair circuit that includes a set of memory cells arranged as either a set of rows or a set of columns. The memory further includes a corresponding set of redundant rows or columns. The repair circuit can test the memory to detect and locate defective cells (i.e., the row or column of the defective memory cell). Then, data for memory cells of the identified row or column are stored in the corresponding redundant row or redundant column. However, for successful implementation of this method, it is essential that the sets of redundant rows and redundant columns are structurally similar to the sets of rows and columns of the memory. Further, the repair circuit requires additional processing and time to determine the row and column of the defective memory cell and substitute either of the identified row or column of the defective cell with the corresponding cells of the redundant row or column.

Therefore, it would be advantageous to have an integrated circuit with a memory that can be repaired not only during factory testing, but also on the fly during a lifetime of the integrated circuit using limited number of resources.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 1 is a schematic block diagram of a memory device in accordance with an embodiment of the present invention.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux. Also, as used herein, Electrically Erasable Programmable Read-Only Memory or "EEPROM" refers to memory with per-byte erase capabilities, "flash" is a type of EEPROM that only supports large-block erasure, and cache memory refers to a relatively small, volatile memory such as a register array.

In one embodiment, the present invention comprises an integrated circuit with on-chip flash memory, on-chip EEPROM, a repair controller, and a cache memory. The flash memory, also referred to as a first non-volatile memory, is used to store a first data packet in a first memory segment having a first address. The first memory segment includes a set of memory cells. The repair controller is connected to the flash memory and receives an error signal therefrom. The error signal indicates that a memory cell of the set of memory cells is defective. The repair controller also receives the first data packet and the first address based on the error signal (i.e., when the error signal is active). The EEPROM is connected to the repair controller. The EEPROM receives and stores the first data packet and the first address when the flash memory generates the error signal. The cache memory is connected to the flash memory and the EEPROM. The cache memory receives a first read address during a read operation from the flash memory. The cache memory also receives and stores the first data packet and the first address from the EEPROM based on a load request signal, and outputs the first data packet when the first read address matches the first address during the read operation.

In another embodiment, the present invention provides a method for repairing a flash memory located on an integrated circuit chip. The flash memory is used to store a first data packet in a first memory segment thereof having a first address. The flash memory includes a memory segment that includes a set of memory cells. The method comprises generating and providing to a repair controller an error signal indicating that a memory cell of the set of memory cells is defective. The method further comprises receiving the first data packet and the first address by the repair controller based on the error signal. The method further comprises receiving the first data packet and the first address from the repair controller by a EEPROM, thereby repairing the flash memory. The method further comprises storing the first data packet and the first address received from the EEPROM in a cache memory based on a load request signal. The method further comprises the cache memory comparing a first read address with the first address during a read operation. The method further comprises the cache memory outputting the first data packet corresponding to the first address during the read operation when the first read address matches the first address.

Various embodiments of the present invention provide a system and method for repairing an on-chip memory. The chip includes a flash memory, a repair controller, a EEPROM, and a cache memory. The flash memory is used to store a first data packet in a first memory segment having a first address. The first memory segment includes a set of memory cells. The flash memory generates an error signal when a memory cell of the set of memory cells is defective. The flash memory stores the first data packet at the first address when the memory cells at that address are not defective. However, when one or the memory cells at the first address is defective, then the first data packet and the first address are stored in the EEPROM by the repair controller based on the error signal. The cache memory is connected to the flash memory and the EEPROM, and receives and stores the first data packet and the first address based on a load request signal. During a read operation, the cache memory receives a first read address. The cache memory outputs the first data packet when the first read address matches the first address.

Thus, the flash memory is repaired by using the EEPROM as a substitute for the memory address(es) having defective cells. One advantage of the aforementioned repair mechanism is that there are no fuses so no fuse programming needs to be performed. Further, the EEPROM may be much smaller than the flash—that is, row or column duplication is not required. Additionally, during a read operation, the cache memory can output the first data packet corresponding to the first address in one flash clock cycle. Thus, the on-chip memory outputs the first data packet in less time than conventional memory devices that employ conventional repair mechanisms. Furthermore, repair of the memory does not have to be performed only during the testing stage at the factory, so if, over time one of the flash memory cells becomes defective such as due to aging, then the defective cells can be repaired on-the-fly. As repair circuitry and method do not need to identify rows or columns of the defective memory cells during self-repair, the flash memory is repaired very quickly.

Referring now to FIG. 1, a portion of an integrated circuit chip 100 including on-chip flash memory is shown. The chip 100 includes a flash memory system 102, a repair controller 104, an electrically erasable programmable read-only memory (EEPROM) 106, a cache loader 108, and a cache memory 110. The flash memory 102 (also referred to as 'a first memory system') includes a flash memory controller 112 and a flash memory 114 (also referred to as 'a first non-volatile memory'). The EEPROM 106 (also referred to as 'a second memory system') includes an EEPROM controller 116, an EEPROM primary array 118, and an EEPROM repair array 120. The cache memory 110 (also referred to as 'a volatile memory') includes first and second address search logic circuits 122 and 124, an address memory array 126, and a data memory array 128. The first and second address search logic circuits 122 and 124 and the address memory array 126 form a content-addressable memory (CAM) 130. The cache memory 110 further includes a first mux 13.

The flash memory 114 includes multiple flash memory sectors, two of which are shown—a first memory sector 136 and a second memory sector 138. The first flash memory sector 136 includes a first set of flash memory segments, three of which are shown—first through third memory segments 136a-136c. The second flash memory sector 138 includes a second set of flash memory segments, three of which are shown—fourth through sixth memory segments 138a-138c. Each flash memory segment of the first and second sets of flash memory segments includes a set of memory cells (not shown). Each flash memory segment also stores a data packet and each memory cell of the set of memory cells stores bits of the data packet. The first flash memory sector 136 stores a first set of data packets, three of which are shown—first through third data packets (DP10-DP12), and the second flash memory sector 138 stores a second set of data packets, three of which are shown—fourth through sixth data packets (DP20-DP22).

The flash memory controller 112 generates an error signal when a defective memory cell of the flash memory 114 is detected. The flash memory segment including the defective memory cell is referred to as a defective memory segment. Further, a data packet stored in the defective memory segment is referred to as a repair data packet and an address of the defective memory segment is referred to as a fault address.

The flash memory controller 112 receives a flash command (FLASH_CMD), write data (WDATA), a read address (RADDR), and a write address (WADDR). The flash memory controller 112 outputs the error signal, a command address (CMD_ADDR), the flash command (FLASH_CMD), and flash data (PDATA_64BIT). The read address (RADDR) denotes an address in the flash memory 114 from which a stored data packet is read. The write address (WADDR) is an address in the flash memory 114 at which a data packet is to be stored. The flash memory 114 outputs a data packet stored at the read address (RADDR) as a first data packet (DP1). The flash command (FLASH_CMD) includes at least one instruction to be executed by the flash memory controller 112 on at least one data packet stored in the flash memory 114. Examples of the flash command (FLASH_CMD) include a program check command, a program command, an all erase command, a block erase command, a sector erase command, a long word program command and the like. The write data (WDATA) includes at least one data packet to be stored in the flash memory 114. When the flash memory controller 112 generates the error signal, the flash data (PDATA_64BIT) includes the at least one data packet to be stored in the EEPROM repair array 120. The command address (CMD_ADDR) is the location in the flash memory 114 at which the flash command (FLASH_CMD) is executed.

The repair controller 104 is connected to the flash memory system 102 for receiving the error signal, a command address hit signal, the flash command (FLASH_CMD), the flash data (PDATA_64BIT), and the command address (CMD_ADDR). The repair controller 104 further outputs a load request signal, EEPROM write data (EEP_WDATA), an EEPROM address (EEP_ADDR), and a command acknowledge signal (CMD_ACK). The flash memory system 102 receives the command acknowledge signal (CMD_ACK). The EEPROM write data (EEP_WDATA) includes a data packet to be stored in the EEPROM repair array 120. The EEPROM address (EEP_ADDR) is an address in the EEPROM repair array 120 at which the data packet of the EEPROM write data (EEP_WDATA) is stored. The command acknowledge signal (CMD_ACK) indicates whether the repair controller 104 has executed the flash command (FLASH_CMD).

The EEPROM system 106 is connected to the repair controller 104 for receiving the EEPROM write data (EEP_WDATA) and the EEPROM address (EEP_ADDR). The EEPROM system 106 outputs EEPROM read data (EEP_RDATA) and EEPROM acknowledge command (EEP_CMD_ACK). The repair controller 104 receives the EEPROM read data (EEP_RDATA) and the EEPROM acknowledge command (EEP_CMD_ACK). The EEPROM repair array 120 includes a set of EEPROM segments 140a-140d (collectively referred to as "EEPROM segment 140"). For illustrative purpose, first through fourth EEPROM segments 140a-140d are shown in the FIG. 1. Each EEPROM segment 140 of the set of EEPROM segments 140 includes a set of EEPROM memory cells (not shown) for storing bits of the repair data packet. Each EEPROM segment 140 stores at least one of the fault address and the repair data packet. For instance, the first EEPROM segment 140a stores a first fault address, the second EEPROM segment 140b stores a first repair data packet, the third EEPROM segment 140c stores a second fault address, and the fourth EEPROM segment 140d stores a second repair data packet. The bit-length of the EEPROM segment 140 is not necessarily the same as the bit-length of each of the first through third flash memory segments 136a-136c and the fourth through sixth flash memory segments 138a-138c.

The cache loader 108 is connected to the repair controller 104 for receiving the load request signal and the EEPROM system 106 for receiving the fault address and the repair data packet. The cache loader 108 outputs the fault address and the repair data packet as a cache address (CACHE_ADDR) and cache data (CACHE_DATA), respectively.

In one embodiment, the cache loader 108 receives an address of the first EEPROM segment 140a and a total number of EEPROM segments 140 of the set of EEPROM segments 140. The cache loader 108 then receives the first fault address and subsequently the first repair data packet, the second fault address, and the second repair data packet in the aforementioned order based on the address of the first EEPROM segment 140a and the total number of EEPROM segments 140.

The cache memory 110 is connected to the cache loader 108 for receiving the cache address (CACHE_ADDR) and the cache data (CACHE_DATA) and generating a read address hit signal and the command address hit signal. The address memory array 126 stores the cache address (CACHE_ADDR). The data memory array 128 stores the cache data (CACHE_DATA). The first and second address search logic circuits 122 and 124 each include a set of address search lines (not shown) connected to the address memory array 126. Further, the first and second address search logic circuits 122 and 124 each include a set of match lines (not shown). Each match line of the set of match lines corresponds to each address stored in the address memory array 126. The first address search logic circuit 122 receives the read address (RADDR) and the second address search logic circuit 122 receives the command address (CMD_ADDR). When either of the command address (CMD_ADDR) or the read address (RADDR) matches an address stored in the address memory array 126, the corresponding match line outputs a match signal. The first address search logic circuit 122 generates the read address hit signal and the second address search logic circuit 124 generates the command address hit signal based on the match signal. The match lines are further connected to an encoder (not shown) in the first address search logic circuit 122 that outputs a select signal based on the match signal. The select signal indicates an address in the data memory array 128 at which the repair data packet is stored. The repair data packet corresponds to the read address (RADDR).

The first mux 132 is connected to the first address search logic circuit 122 for receiving the select signal and the data memory array 128 for receiving the repair data packet. Further, the first mux 132 outputs the repair data packet as a second data packet (DP2) based on the select signal.

The second mux 134 is connected to the flash memory 114 for receiving the first data packet (DP1) and the cache memory 110 for receiving the read address hit signal and the second data packet. The second mux 134 outputs at least one of the first and second data packets as read data (RDATA) based on the read address hit signal. When the read address (RADDR) does not match the fault address; the read data (RDATA) is the first data packet (DP1) that is stored at an address in the flash memory 114 indicated by the read address (RADDR). When the read address (RADDR) matches the fault address; the read data (RDATA) is the second data packet (DP2) stored in the data memory array 128 at the fault address, which is stored in the address memory array 126.

In one embodiment, the flash memory controller 112 includes a flash memory register (not shown) corresponding to the first and second sets of flash memory segments 136 and 138. The flash memory controller 112 tests each memory cell of the first through third and fourth through sixth sets of flash memory segments 136a-136c and 138a-138c. The flash memory register stores a status corresponding to each memory cell of the first and second sets of flash memory segments 136 and 138 in which data packets are to be stored. The status indicates whether each of the memory cells includes an error and is thus a defective memory cell.

The flash memory controller 112 performs a self-test to identify damaged memory cells in the flash memory 114. The flash memory controller 112 may be programmed to perform one of the three types of self-tests—a factory test, a user program test, and a user self-test. During the factory test, the flash memory controller 112 tests each memory cell of the flash memory 114. Generally, the factory test is performed before the integrated circuit 100 is shipped to a customer.

The user program test is performed during storing of a user application program in the chip 100. The user application program is a program code that includes a set of instructions, which are stored in the flash memory 114. In one embodiment, the flash memory controller 112 receives a first instruction of the set of instructions as write data (WDATA) during the user program test. Then, the flash memory controller 112 tests the first flash memory segment 136a and updates the flash memory register with its status. When the status indicates that there is no faulty memory cell in the first memory segment 136a, the flash memory controller 112 stores the first instruction as the first data packet (DP10) in the first flash memory segment 136a. However, when the first flash memory segment 136a includes a faulty memory cell, the flash memory controller 112 updates the flash memory register with a status indicating that the first flash memory segment 136a is a defective memory segment. The flash memory controller 112 then either discards the first instruction or tests the second flash memory segment 136b. Once the first instruction is stored in the flash memory 114, the flash memory controller 112 receives a second instruction of the set of instructions and the aforementioned sequence steps repeats. Thus, in the user program test, the flash memory controller 112 tests only the flash memory segments in which the set of instructions i.e. the user application program is stored. Consequently, the user program test uses less time and resources.

During the user self-test, the flash memory controller 112 tests limited number of memory cells of the first and second memory segments 136 and 138 to determine the presence of faulty or defective memory cells in the flash memory 114. The flash memory controller 112 tests memory cells in a series. In one instance, the flash memory controller 112 tests alternate memory cells i.e. a first memory cell, a third memory cell, a fifth memory cell and so on. In a subsequent step of testing, the flash memory controller 112 tests a second memory cell, a fourth memory cell, a sixth memory cell and so on. Thus, the flash memory controller 112 does not test all the memory cells of the first and second memory segments 136 and 138. Further, the user self-test can be performed periodically to identify the presence of defective cells in the flash memory 114.

When the flash memory controller 112 performs at least one of the factory test, the user program test, and the user self-test, the flash memory controller 112 stores a corresponding status in the flash memory register. The status indicates the presence of at least one defective memory cell in the flash memory 114.

In one embodiment, the flash memory controller 112 performs the factory test. The flash memory controller 112 identifies that the first flash memory segment 136a includes a defective memory cell. Thus, the first flash memory segment 136a is a defective flash memory segment. An address (ADDR_10) of the first flash memory segment 136a is referred to as a defective address (ADDR_10).

The flash memory controller 112 receives a write address (WADDR) and a data store command as the flash command (FLASH_CMD) along with the first data packet (DP10) as the write data (WDATA). In one embodiment, the write address (WADDR) matches the defective address (ADDR_10). Thus, the first data packet (DP10), which is to be stored at the defective address (ADDR_10), is referred to as the repair data packet (DP10). The flash memory controller 112 checks the flash memory register for the status of a memory cell of the first flash memory segment 136a and outputs the fault address (ADDR_10) and the repair data packet (DP10) as the flash data (PDATA_64BIT). Further, the flash memory controller 112 outputs the error signal.

The repair controller 104 receives the defective fault address (ADDR_10) and the repair data packet (DP10) as the flash data (PDATA_64BIT). Further, the repair controller 104 receives the error signal and outputs first and second EEPROM register addresses as EEPROM address (EEP_ADDR).

The EEPROM system 106 includes a first EEPROM register (not shown) for storing a start address of the EEPROM repair array 120 as first EEPROM register data and a second EEPROM register (not shown) for storing second EEPROM register data. The second EEPROM register data includes a number of EEPROM segments 140 utilized for repair in the EEPROM repair array 120. The first and second EEPROM register addresses are addresses of the first and second EEPROM registers in the EEPROM system 106. The EEPROM repair array 120 receives the first and second EEPROM register addresses and outputs the first and second EEPROM register data as EEPROM read data (EEP_RDATA). The repair controller 104 checks the availability of the EEPROM segments 140 in the EEPROM repair array 120 based on the EEPROM read data (EEP_RDATA) and the bit-length of the fault address (ADDR_10) and the corresponding first data packet (DP10).

When the EEPROM read data (EEP_RDATA) indicates the availability of the EEPROM segments 140 in the EEPROM repair array 120, the repair controller 104 determines a first EEPROM address at which the fault address (ADDR_10) can be stored. Further, the repair controller 104 determines a second EEPROM address at which the repair data packet (DP10) can be stored. When a bit-length of the EEPROM segment 140 is not equal to a bit-length of a flash memory segment of the first through third flash memory segments 136a-136c and the fourth through sixth flash memory segments 138a-138c of the flash memory 114, the repair controller 104 modifies the repair data packet (DP10) storing process and generates modified data (EEP_WDATA). When the bit-length of the EEPROM segment 140 is equal to the bit-length of a flash segment of the first through third flash memory segments 136a-136c and the fourth through sixth flash memory segments 138a-138c of the flash memory 114, the repair controller 104 does not generate modified data (EEP_WDATA).

In one example, when the bit-length of the defective address (ADDR_10) is 32 bits, the bit-length of the repair data packet (DP10) is 64 bits, and the bit-length of the EEPROM segment 140 is 32 bits, the repair controller 104 modifies the flash data (PDATA_64BIT) to generate first modified data corresponding to 32 bits of the fault address (ADDR_10), second modified data corresponding to the first 32 bits of the repair data packet (DP10) and third modified data corresponding to the subsequent 32 bits of the repair data packet (DP10). Further, the repair controller 104 generates first through third EEPROM addresses at which the first through third modified data are stored. Further, the repair controller 104 generates first through third store commands corresponding to the first through third modified data. When the EEPROM controller 116 receives the first store command as the EEPROM system command (EEP_CMD), the first EEPROM address as the EEPROM address (EEP_ADDR) and the first modified data as the EEPROM write data (EEP_WDATA), the EEPROM controller 116 stores the first modified data at the first EEPROM address in the EEPROM repair array 120. Similarly, the EEPROM controller 116 stores the second modified data at the second EEPROM address and the third modified data at the third EEPROM address in the EEPROM repair array 120.

In the preferred example, the bit-length of the defective address (ADDR_10) is 32 bits; the bit-length of the repair data packet (DP10) is 64 bits, and the bit-length of the EEPROM segment 140 is 64 bits. The repair controller 104 generates first and second store commands. The repair controller 104 also generates first and second EEPROM addresses. The first and second EEPROM addresses correspond to the address of the first EEPROM segment 140a and the second EEPROM segment 140b, respectively.

The repair controller 104 outputs the first store command as the first EEPROM system command (EEP_CMD) to the EEPROM system 106, the defective address (ADDR_10) as the EEPROM write data (EEP_WDATA) and the first EEPROM address (EEP_ADDR). The EEPROM controller 116 receives the first EEPROM system command (EEP_CMD), the first EEPROM address (EEP_ADDR), and the fault address (ADDR_10) and stores the fault address (ADDR_10) at the corresponding EEPROM address (EEP_ADDR) in the EEPROM repair array 120. Further, the EEPROM controller 116 outputs a first EEPROM acknowledge command (EEP_CMD_ACK). The repair controller 104 receives the first EEPROM acknowledge command (EEP_CMD_ACK). The first EEPROM acknowledge command (EEP_CMD_ACK) indicates to the repair controller 104 that the EEPROM controller 116 has successfully stored the fault address (ADDR_10) in the EEPROM repair array 120. Thus, the repair controller 104 outputs the second store command as the second EEPROM system command (EEP_CMD), the repair data packet (DP10) as the EEPROM write data (EEP_WDATA), and the second EEPROM address (EEP_ADDR). The EEPROM controller 116 receives the second EEPROM system command (EEP_CMD), the second EEPROM address (EEP_ADDR) and the repair data packet (DP10) and stores the repair data packet (DP10) at the second EEPROM address (EEP_ADDR) in the EEPROM repair array 120. The EEPROM controller 116 also outputs a second EEPROM acknowledge command (EEP_CMD_ACK). The second EEPROM acknowledge command (EEP_CMD_ACK) indicates to the repair controller 104 that the EEPROM controller 116 has successfully stored the repair data packet (DP10) in the EEPROM repair array 120.

The repair controller 104 receives the second EEPROM acknowledge command (EEP_CMD_ACK), and outputs the load request signal and the command acknowledge signal (CMD_ACK) to the cache loader 108 and the flash memory controller 112, respectively. The command acknowledge signal (CMD_ACK) indicates to the flash memory controller 112 that the repair controller 104 has successfully stored the fault address (ADDR_10) and the repair data packet (DP10) in the EEPROM repair array 120. The flash memory controller 112 receives the command acknowledge signal (CMD_ACK) and executes the subsequent flash command (FLASH_CMD).

Alternately, in case the repair controller 104 fails to store the defective address (ADDR_10) and the repair data packet (DP10) in the EEPROM repair array 120, the repair controller 104 outputs a failed command acknowledge signal (CMD_ACK) to the flash memory controller 112. The flash memory controller 112 receives the failed command acknowledge signal (CMD_ACK) and outputs an error message. In one embodiment, a processor (not shown) connected to the flash memory controller 102 receives the error message. In another embodiment, the error message is displayed to a user of the chip 100.

The cache loader 108 receives the load request signal from the repair controller 104, the address of the first EEPROM segment 140a from the first EEPROM register and the total number of the set of EEPROM segments 140 from the second EEPROM register. The cache loader 108 also receives the fault address (ADDR_10) stored in the first EEPROM segment 140a. The cache loader 108 outputs the fault address (ADDR_10) as the cache address (CACHE_ADDR) to the address memory array 126 of the cache memory 110. Then, the cache loader 108 receives the repair data packet (DP10) stored in the second EEPROM segment 140b. The cache loader 108 outputs the repair data packet (DP10) as the cache data (CACHE_DATA) to the data memory array 128 of the cache memory 110.

In another embodiment, the write address (WADDR) does not match the fault address (ADDR_10). The flash memory controller 112 stores the repair data packet (DP10) at an address indicated by the write address (WADDR) in the flash memory 114.

During a read operation, the flash memory system 102 receives a read address (RADDR). In one embodiment, the read address (RADDR) matches the fault address (ADDR_10). The flash memory 114 outputs an inaccurate data packet stored at the address indicated by the read address (RADDR) as the first data packet (DP1). The first address search logic circuit 122 receives and compares the read address (RADDR) with at least one address stored in the address memory array 126. The first address search logic circuit 122 outputs the read address hit signal at a high logic state when the read address (RADDR) matches the fault address (ADDR_10). The first address search logic circuit 122 also outputs the select signal when the read address (RADDR) matches the fault address (ADDR_10). The select signal indicates the address of the repair data packet (DP10) corresponding to the read address (RADDR) in the data memory array 128. The first mux 132 receives the select signal and the repair data packet (DP10) and outputs the repair data packet (DP10) as the second data packet (DP2) corresponding to the fault address (ADDR_10). The second mux 134 receives the second data packet (DP2), the first data packet (DP1), and the read address hit signal at the high logic state. The second mux 134 outputs the second data packet (DP2) as the read data (RDATA).

In another embodiment, the read address (RADDR) does not match the fault address (ADDR_10). In one example, the read address (RADDR) corresponds to an address of the second flash memory segment 136b. Thus, the flash memory 114 outputs the second data packet (DP11) stored at the address indicated by the read address (RADDR) as the first data packet (DP1). The first address search logic circuit 122 receives the read address (RADDR) and compares the read address (RADDR) with the at least one address stored in the address memory array 126. The first address search logic circuit 122 outputs the read address hit signal at a low logic state when the read address (RADDR) does not match the fault address (ADDR_10). Further, the first address search logic circuit 122 outputs an inaccurate select signal. The first mux 132 outputs a random data packet as the second data packet (DP2). The second mux 134 receives the second data packet (DP2), the first data packet (DP1), and the read address hit signal at the low logic state. The second mux 134 outputs the first data packet (DP1) as the read data (RDATA).

In an alternate embodiment, when the flash memory system 102 receives the flash command (FLASH_CMD) and the write address (WADDR), the write address (WADDR) indicates an address in the flash memory 114 at which the flash command (FLASH_CMD) is to be executed. The flash memory controller 112 outputs the write address (WADDR) as the command address (CMD_ADDR).

In one embodiment, the write address (WADDR) matches the fault address (ADDR_10). The second address search logic circuit 124 receives the command address (CMD_ADDR) and outputs the command address hit signal at a high logic state since the command address (CMD_ADDR) matches at least one address stored in the address memory array 126. The repair controller 104 receives the command address hit signal and outputs the command acknowledge signal (CMD_ACK). The command acknowledge signal (CMD_ACK) indicates to the flash memory controller 112 that the write address (WADDR) matches at least one address stored in the address memory array 126. The flash memory controller 112 receives the command acknowledge signal (CMD_ACK) and outputs the flash command (FLASH_CMD).

The repair controller 104 receives the write address (WADDR) as the command address (CMD_ADDR) and the flash command (FLASH_CMD). The repair controller 104 modifies the flash command (FLASH_CMD) to the EEPROM system command (EEP_CMD) and the command address (CMD_ADDR) to a modified address (EEP_ADDR). The modified address (EEP_ADDR) indicates the address of the EEPROM segment 140b at which the first data packet (DP10) is stored. Further, the repair controller 104 outputs the EEPROM system command (EEP_CMD) and the modified address (EEP_ADDR). The EEPROM controller 116 receives the EEPROM system command (EEP_CMD) and the modified address (EEP_ADDR) and executes the EEPROM system command (EEP_CMD) on the first data packet (DP10) stored in the EEPROM repair array 120 at the address indicated by the command address (CMD_ADDR). The EEPROM controller 116 outputs the EEPROM acknowledge command (EEP_CMD_ACK). The EEPROM acknowledge command (EEP_CMD_ACK) indicates to the repair controller 104 that the EEPROM controller 116 has successfully executed the EEPROM system command (EEP_CMD). The repair controller 104 receives the EEPROM acknowledge command (EEP_CMD_ACK) and outputs the command acknowledge signal (CMD_ACK) to the flash memory system 102. The command acknowledge signal (CMD_ACK) indicates to the flash memory system 102 that the repair controller 104 has successfully executed the flash command (FLASH_CMD).

In another embodiment, the write address (WADDR) does not match the fault address (ADDR_10). The second address search logic circuit 124 receives the command address (CMD_ADDR) and outputs the command address hit signal at a low logic state, since the command address (CMD_ADDR) does not match at least one address stored in the address memory array 126. The repair controller 104 receives the command address hit signal and outputs the command acknowledge signal (CMD_ACK). The command acknowledge signal (CMD_ACK) indicates to the flash memory controller 112 that the write address (WADDR) does not match at least one address stored in the address memory array 126. The flash memory controller 112 receives the command acknowledge signal (CMD_ACK). Further, the flash memory controller 112 executes the flash command (FLASH_CMD) on the second data packet (DP11) stored at the address indicated by the write address (WADDR) in the flash memory 114.

Thus, the flash memory system 102 is repaired using the EEPROM system 106, which is not the same type of memory as the flash memory system 102. The aforementioned repair mechanism may also be implemented for the repair of an EEPROM system. Further, during a read operation, the cache memory 110 outputs data in one flash clock cycle. Additionally, the chip 100 has a faster fetching time than conventional memory devices. The chip 100 can be realized using existing design procedures such as register-transfer level design. The chip 100 uses the first and second EEPROM segments 140a and 140b for repairing the errors in the first flash memory sector 136 instead of a redundant flash memory sector. Hence, the aforementioned repair mechanism is economical compared to the prior art solutions that utilize a redundant flash memory sector. Further, the aforementioned repair mechanism substitutes less number of memory cells that do not include errors compared to the prior art solutions.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A memory device that is part of an integrated circuit chip, the memory device comprising:
   a first on-chip memory system including a first non-volatile memory for storing a first data packet in a first memory segment having a first address, wherein the first memory segment includes a set of memory cells;
   a repair controller connected to the first memory system, wherein the repair controller receives an error signal indicating that a memory cell of the set of memory cells is defective, and receives the first data packet and the first address based on the error signal;
   a second on-chip memory system including a second non-volatile memory connected to the repair controller, wherein the second memory system receives and stores the first data packet and the first address based on the error signal; and
   a cache memory connected to the first and second memory systems, wherein:
      the cache memory receives a first read address during a read operation, and
      the cache memory receives and stores the first data packet and the first address from the second memory system based on a load request signal, and outputs the first data packet when the first read address matches the first address.

2. The memory device of claim 1, wherein the cache memory includes a content-addressable memory (CAM) that stores the first address, wherein the CAM compares the first read address with the first address, and the cache memory outputs the first data packet when the first read address matches the first address.

3. The memory device of claim 2, wherein during the read operation, the CAM generates a read address hit signal and a select signal when the first read address matches the first address.

4. The memory device of claim 3, wherein the cache memory includes a first multiplexer that receives the first data packet and the select signal, and outputs the first data packet based on the select signal.

5. The memory device of claim 4, further comprising a second multiplexer connected to the first memory system, wherein:
   the second multiplexer receives a second data packet of a second memory segment of the first non-volatile memory, and the data packet from the first multiplexer; and
   the second multiplexer outputs one of the second data packet and the first data packet based on the read address hit signal.

6. The memory device of claim 2, wherein:
   the first non-volatile memory is a flash memory, and the second non-volatile memory is an electrically erasable programmable read-only memory (EEPROM).

7. The memory device of claim 6, wherein:
   the first memory system receives a first flash command and a first flash memory address, and outputs the first flash memory address; and
   the CAM compares the first flash memory address with the first address and outputs a command address hit signal when the first flash memory address matches the first address.

8. The memory device of claim 7, wherein the repair controller receives the command address hit signal, the first flash command, and the first flash memory address, and outputs a first modified flash command based on the command address hit signal.

9. The memory device of claim 8, wherein the repair controller generates the load request signal when one of the second memory system stores the first data packet and the second memory system executes the first modified flash command.

10. The memory device of claim 9, wherein:
the first and second memory systems each further include first and second memory controllers, respectively;
the first memory controller identifies the error in the memory cell of the set of memory cells and generates the error signal; and
the second memory controller executes the first modified flash command on the first data packet stored in the second non-volatile memory.

11. A method for repairing a first non-volatile memory of a first memory system that is used to store a first data packet in a first memory segment thereof having a first address, wherein the first memory segment includes a set of memory cells, the method comprising:
generating and providing to a repair controller an error signal indicating that a memory cell of the set of memory cells is defective;
receiving the first data packet and the first address by the repair controller based on the error signal;
storing the first data packet and the first address in a second non-volatile memory, wherein the second non-volatile memory receives the first data packet and the first address from the repair controller;
storing the first data packet and the first address in a cache memory based upon receipt of a load request signal, wherein the cache memory receives the first data packet and the first address from the second non-volatile memory;
comparing a first read address with the first address during a read operation; and
outputting the first data packet from the cache memory when the first read address matches the first address, thereby repairing the first non-volatile memory.

12. The method of claim 11, wherein the cache memory includes a content-addressable memory (CAM), the method further comprising storing the first address in the CAM, and wherein the CAM compares the first read address and the first address.

13. The method of claim 12, further comprising generating a read address hit signal and a select signal by the CAM when the first read address matches the first address.

14. The method of claim 13, further comprising:
providing the first data packet and the select signal to a first multiplexer; and
outputting the first data packet by the first multiplexer based on the select signal.

15. The method of claim 14, further comprising:
providing to a second multiplexer a second data packet stored in a second memory segment of the first non-volatile memory, the first data packet from the first multiplexer, and the read address hit signal from the CAM; and
outputting one of the first and second data packets by the second multiplexer based on the read address hit signal.

16. The method of claim 12, wherein the first non-volatile memory comprises a flash memory and the second non-volatile memory comprises an electrically erasable programmable memory (EEPROM), the method further comprising generating a command address hit signal by the CAM when a first flash memory address matches the first address during the read operation.

17. The method of claim 16, further comprising the repair controller receiving a first flash command and the first flash memory address and modifying the first flash command to generate a first modified flash command based on the command address hit signal.

18. The method of claim 17, further comprising executing the first modified flash command by a memory controller of the EEPROM on the first data packet stored in the EEPROM.

19. The method of claim 18, further comprising generating the load request signal by the repair controller when one of the first data packet is stored in the EEPROM, and the EEPROM executes the first modified flash command.

20. The method of claim 11, wherein a memory controller of the first memory system generates the error signal.

* * * * *